United States Patent
Dubin

Patent Number: 5,895,562
Date of Patent: Apr. 20, 1999

[54] GAS SHIELDING DURING PLATING

[75] Inventor: Valery Dubin, Cupertino, Calif.

[73] Assignee: Advanced Micro Devices, Inc., Sunnyvale, Calif.

[21] Appl. No.: 09/127,875

[22] Filed: Aug. 3, 1998

Related U.S. Application Data

[62] Division of application No. 08/878,516, Jun. 19, 1997, Pat. No. 5,833,820.

[51] Int. Cl.$^6$ .............. C25D 5/00; C25D 7/12; C25D 3/58; B23P 9/00
[52] U.S. Cl. .............. 205/137; 205/157; 205/162; 205/239; 205/291; 428/687
[58] Field of Search .............. 205/137, 157, 205/162, 239, 291; 428/687

[56] References Cited

U.S. PATENT DOCUMENTS

| | | | |
|---|---|---|---|
| 3,071,521 | 1/1963 | Ehrhart | 204/16 |
| 4,133,920 | 1/1979 | Schulthess | 427/282 |
| 4,574,095 | 3/1986 | Baum et al. | 427/53.1 |
| 4,731,518 | 3/1988 | Parmelee et al. | 219/137.31 |
| 4,789,648 | 12/1988 | Chow et al. | 437/225 |
| 4,894,260 | 1/1990 | Kumasaka et al. | 427/241 |
| 5,093,279 | 3/1992 | Andreshak et al. | 437/173 |
| 5,240,497 | 8/1993 | Shacham et al. | 106/1.26 |
| 5,262,354 | 11/1993 | Cote et al. | 437/195 |
| 5,280,154 | 1/1994 | Cuomo et al. | 219/121.52 |
| 5,409,587 | 4/1995 | Sandhu et al. | 204/192.12 |
| 5,429,733 | 7/1995 | Ishida | 204/224 R |
| 5,472,592 | 12/1995 | Lowery | 205/137 |
| 5,660,699 | 8/1997 | Saito et al. | 204/297 |

OTHER PUBLICATIONS

Ting et al., "Selective Electroless Metal Deposition For Integrated Circuit Fabrication", J. Electrochem. Soc., vol. 136, No. 2, Feb. 1989, pp. 456–462.

Ting et al., "Selective Electroless Metal Deposition for Via Hole Filing in VLSI Multilevel Interconnection Structures", J. Electochem. Soc., vol. 136, No. 2, Feb. 1989, pp. 462–466.

S.M. Rossnagel et al., "Metal ion deposition from ionized magnetron sputtering discharge", J. Vac. Sci. Technol. B 12(1), Jan./Feb. 1994, pp. 449–453.

J. Hopwood et al., "Mechanisms for highly ionized magnetron sputtering", J. Appl. Phys., vol. 78, No. 2, Jul. 15, 1995, pp. 758–765.

Joshi, "A New Damascene Structure for Submicrometer Interconnect Wiring", IEEE Electron Device Letters, vol. 14, No. 3, Mar. 1993, pp. 129–132.

Kaanta et al., "Dual Damascene: A USLI Wiring Technology", VMIC Conference, Jun. 11–12, 1991, pp. 144–152.

Kenney et al., "A Buried–Plate Trench Cell for a 64–Mb DRAM", Symposium on VLSI Technology Digest of Technical Papers, 1992, pp. 14–15, no month.

*Primary Examiner*—Kathryn Gorgos
*Assistant Examiner*—Edna Wong

[57] ABSTRACT

Gas shielding is employed to prevent metal plating on contacts during electroplating to reduce particulate contamination and increase thickness uniformity. In another embodiment, gas shielding is employed to prevent deposition on the backside and edges of a semiconductor wafer during plating.

9 Claims, 3 Drawing Sheets

5,895,562

GAS SHIELDING DURING PLATING

This application is a divisional of application Ser. No. 08/878,516 filed Jun. 19, 1997 now U.S. Pat. No. 5,833,820.

TECHNICAL FIELD

The present invention relates to a method and apparatus for electroless plating and electroplating a metal on a substrate comprising a seed layer. The present invention is applicable to plating copper or a copper alloy on a semiconductor substrate, particularly in forming integrated circuits having submicron design features.

BACKGROUND ART

The escalating requirements for high density and performance associated with ultra large scale integration (ULSI) semiconductor wiring require responsive changes in interconnection technology, which is considered one of the most demanding aspects of ultra large scale integration technology. Such escalating requirements have been found difficult to satisfy in terms of providing a low RC (resistance capacitance) interconnect pattern, particularly wherein submicron vias, contacts and trenches have high aspect ratios due to miniaturization.

Conventional semiconductor devices comprise a semiconductor substrate, normally of monocrystalline silicon, and a plurality of sequentially formed dielectric interlayers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via opening, while a conductive plug filling a contact opening establishes electrical contact with an active region on a semiconductor substrate, such as a source/drain region. Conductive lines formed in trench openings typically extend substantially horizontal with respect to the semiconductor substrate. Semiconductor "chips" comprising three and four levels of metallization are becoming more prevalent as device geometries shrink to submicron levels.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Thus, the interconnection pattern limits the speed of the integrated circuit.

In ULSI structures, high circuit speeds, high packing density and low powered dissipation are required. Consequently, feature sizes must be scaled down. The interconnect related time delays become the major limitation in achieving high circuit speeds. Shrinking device size automatically miniaturizes the interconnect feature size which increases interconnect resistance and interconnect current densities. Poor step coverage of metal and submicron high aspect ratio via holes also increases interconnect resistance and electromigration failures.

If the interconnection node is routed over a considerable distance, e.g., hundreds of microns or more, as in submicron technologies, the interconnection capacitance limits the circuit node capacitance loading and, hence, the circuit speed. As integration density increases and feature size decreases in accordance with submicron design rules, the rejection rate due to integrated circuit speed delays approaches and even exceeds 20%.

One way to increase the control speed of semiconductor circuitry is to reduce the resistance of a conductive pattern. Conventional metallization patterns are typically formed by depositing a layer of conductive material, notably aluminum (Al) or an alloy thereof, and etching, or by damascene techniques wherein trenches are formed in dielectric layers and filled with a conductive material. Excess conductive material on the surface of the dielectric layer is then removed, as by chemical-mechanical polishing. Al is conventionally employed because it is relatively inexpensive, exhibits low resistivity and is relatively easy to etch. However, as the size of openings for vias/contacts and trenches is scaled down to the submicron range, step coverage problems have arisen involving the use of Al which has decreased the reliability of interconnections formed between different wiring layers. Such poor step coverage results in high current density and enhanced electromigration. Moreover, low dielectric constant polyimide materials, when employed as dielectric interlayers, create moisture/bias reliability problems when in contact with Al.

One approach to improved interconnection paths in vias comprises the use of completely filled plugs of a metal, such as W. Accordingly, many current semiconductor devices utilizing VLSI (very large scale integration) technology employ Al for a wiring metal and W plugs for interconnections at different levels. However, the use W is attendant with several disadvantages. For example, most W processes are complex and expensive. Moreover, W has a high resistivity. The Joule heating may enhance electromigration of adjacent Al wiring. Furthermore, W plugs are susceptible to void formation and the interface with the wiring layer usually results in high contact resistance.

Another attempted solution for the Al plug interconnect problem comprises the use of chemical vapor deposition (CVD) or physical vapor deposition (PVD) at elevated temperatures for Al deposition. The use of CVD for depositing Al has proven expensive, while hot PVD Al deposition requires very high process temperatures incompatible with manufacturing integrated circuitry.

Copper (Cu) has recently received considerable attention as a replacement material for Al in VLSI interconnect metallizations. Cu exhibits superior electromigration properties and has a lower resistivity than Al. In addition, Cu has improved electrical properties vis-à-vis W, making Cu a desirable metal for use as a conductive plug as well as conductive wiring. For comparable performance characteristics, aluminum interconnect lines typically exhibit a current density limit of $2 \times 10^5$ amp/cm$^2$; whereas, a copper line would typically exhibit a current density limit of $5 \times 10^6$ amp/cm$^2$. Cu electromigration in interconnect lines has a high activation energy, i.e., up to twice as large as that of Al. Consequently, Cu lines that are significantly thinner than Al lines can theoretically be employed, thereby reducing cross talk and capacitance.

It is expected that a Cu interconnect material leads to an improvement of one and one half times in the maximum clock frequency of a complimentary metal-oxide semiconductor (CMOS) chip vis-à-vis the Al-based interconnects for devices with effective channel ends of about 0.25 μm. Such favorable electrical characteristics of Cu provide an incentive for developing Cu films as interconnect layers in ULSI devices as well top metal layers. However, there are also disadvantages attendant upon the use of Cu. For example, Cu metallization is very difficult to etch. Moreover, Cu readily diffuses through silicon dioxide, the typical dielectric interlayer material employed in the manufacture of semiconductor devices, and adversely affects the devices.

One conventional approach in attempting to form Cu plugs and wiring comprises the use of damascene structures employing chemical mechanical polishing, as in Chow et al., U.S. Pat. No. 4,789,648. However, due to Cu diffusion through dielectric interlayer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium tungsten (TiW), and silicon nitride ($Si_3N_4$) for encapsulating Cu. The use of such barrier materials to encapsulate Cu is not limited to the interface between Cu and the dielectric interlayer, but includes interfaces with other metals as well.

Electroless deposition has been suggested as a technique for forming interconnect structures. See, for example, "Electroless Cu for VLSI," Cho et al., MRS Bulletin, June 1993, pp. 31–38; "Selective Electroless Metal Deposition For Integrated Circuit Fabrication," Ting et al., J. Electrochem. Soc., 136, 1989, p. 456 et seq.; "Selective Electroless Metal Deposition For Via Hole Filling in VLSI Multilevel Interconnection Structures," Ting et al., J. Electrochem. Soc., 136, 1989, p. 462 et seq.; and Shacham et al., U.S. Pat. No. 5,240,497.

Electroless Cu deposition is attractive due to low processing costs and high quality Cu deposits. In addition, equipment for performing electroless metal deposition is relatively inexpensive vis-à-vis other semiconductor processing equipment for depositing metals. Electroless deposition also offers the advantageous opportunity for batch processing of wafers, thereby further reducing the cost of electroless deposition and increasing production throughput. However, electroless deposition requires a catalytic surface, i.e., seed layer, for the autocatalytic action to occur. See, for example, Baum et al., U.S. Pat. No. 4,574,095 and "Electroless Copper Deposition on Metals and Silicides," Mak, MRS Bulletin, August 1994, pp. 55–62. It is difficult to obtain reliable and reproducible electroless Cu deposition, since the seed layer surface must maintain catalytic activity for effective electroless deposition of Cu.

Copending application Ser. No. 08/587,264, filed Jan. 16, 1996, discloses a method of electrolessly depositing Cu in an interconnect structure, which method comprises initially depositing a barrier layer in an opening, depositing a catalytic seed layer, preferably of Cu, on the barrier layer, and then depositing a protective layer on the catalytic layer encapsulating and protecting the catalytic layer from oxidation. The preferred protective material is Al which forms an Al-Cu alloy at the interface of the catalytic and protective layers, thereby encapsulating the underlying Cu. Subsequently, Cu is electrolessly deposited from an electroless deposition solution which dissolves the overlying protective alloy layer to expose the underlying catalytic Cu layer.

As the aspect ratio of contact and via openings, as well as trench openings, approaches 2:1 and greater, it becomes increasingly more challenging to voidlessly fill openings for contacts, vias and trenches of interconnect patterns employing conventional technology, such as magnetron sputtering techniques involving either direct current or radio frequency sputtering. Conventional attempts to improve sputtering capabilities comprise the use of a collimator as in Sandhu et al., U.S. Pat. No. 5,409,587.

A more recent approach in the evolution of high aspect ratio contact/via interconnection technology involves the ionization of sputtered metals by a high density plasma. See S. M. Rossnagel et al., "Metal ion deposition from ionized magnetron sputtering discharge," J. Vac. Sci. Technol. B 12(1), Jan/Feb 1994, pp. 449–453 and J. Hopwood et al., "Mechanisms for highly ionized magnetron sputtering," J. Appl. Phys., Vol. 78, No. 2, Jul. 15, 1995, pp. 758–765. Further attempts to improve RF induced plasma processing by generating a greater percent of ionized sputtered material employing a coil having a generally flattened surface defined by parallel conductors is disclosed by Cuomo et al., U.S. Pat. No. 5,280,154.

Although electroless deposition and electroplating offer the prospect of low cost, high throughput, high quality plated films and efficient via, contact and trench filling capabilities, the requirement for a catalytic seed layer becomes problematic, particularly in filling high aspect ratio openings. Electroless plating generally involves the controlled autocatalytic deposition of a continuous film on the catalytic surface by the interaction in solution of a metal salt and a chemical reducing agent. Electroplating comprises the electrodeposition of an adherent metallic coating on an electrode employing externally supplied electrons to reduce metal ions in the plating solution. A seed layer is required to catalyze electroless deposition or to carry electrical current for electroplating. For electroplating, the seed layer must be continuous. However, for electroless plating, very thin catalytic layers, e.g., less than 100 Å, can be employed in the form of islets of catalytic metal.

Electroless plating has been applied to the manufacture of optical disks. See for example, Kumisaka et al., U.S. Pat. No. 4,894,260.

It is very difficult to form a high conductivity interconnect pattern having high aspect ratio openings employing Cu or a Cu alloy, e.g., a Cu-base alloy, by electroless plating or electroplating, because sputtered catalytic seed layer materials particularly Cu, exhibits extremely poor step coverage, particularly for high aspect ratio openings, e.g., contact, via or trench openings of about 2:1 and greater. Such poor step coverage would inhibit electroplating due to discontinuities of the Cu seed layer, and inhibit electroless Cu deposition for failure of Cu to reach the bottom and lower side walls of high aspect ratio vias/contacts or trenches. In addition, Cu has poor adhesion to dielectric materials and requires encapsulation to prevent diffusion.

A solution to such problems was addressed in copending application Ser. No. 08/857,129 filed May 15, 1997 (Our Docket No. 1033-226), now pending, wherein a method for electroplating and electroless plating Cu is disclosed, comprising depositing a seed layer containing a catalytically active metal, such as Cu, alloyed with a refractory metal, prior to electroless plating or electroplating. In copending application Ser. No. 08/768,447 filed Dec. 18, 1996, pending, an electroless deposition technique is disclosed comprising the use of a spray process in lieu of liquid immersion, wherein itemized droplets of an electroless plating solution are sprayed onto a substrate.

There are significant difficulties attendant upon the application of electroless plating and electroplating in the context of a semiconductor substrate, particularly for ULSI application. For example, during electroplating, metallic contact fingers are typically employed to provide electrical contact with a seed layer on a substrate. During the electroplating process itself, metal from the electroplating solution is disadvantageously electroplated on the contact fingers, thereby generating contaminating particles, as when the electroplated metal is delaminated from the contact fingers. In addition, electroplated metal on the contact fingers increases contact resistance resulting in a high voltage drop and failure.

A conventional approach to the problem of electroplating on contact fingers comprises frequent removal of electroplated metal from the contact fingers, as by wiping or etching, to improve the reliability of the electrical contact. Such approaches are inefficient and time consuming.

Another problem frequently encountered in electroless plating or electroplating a metal on a substrate is the undesirable electrodeposition of metal on the backside and on the edges of the substrate. A satisfactory solution to that problem has not yet surfaced in the art.

A conventional wafer plating is disclosed in U.S. Pat. No. 5,429,733, which issued on Jul. 4, 1995 to Ishida. In the plating device disclosed by Ishida, the lower surface of the circumferential edge of the wafer is restrained by a holding means onto a positioning base portion formed in an opening portion of a plating bath, and a plating fluid is applied onto the lower surface of the wafer. An air bag is employed as a holding means for downwardly depressing the wafer after plating. The air bag constrains only the upper surface of the circumferential edge of the wafer at an expanded state and releases the constraint by contracting to restore an initial configuration in a non-expanded state. The backside of the wafer and the edge of the wafer are not exposed to the plating solution. However, the wafer is not rotated. As a result, the plating thickness uniformity is reduced and the loss of the plating solution is increased since excess plating solution cannot be removed by wafer spinning.

Another wafer plating device is disclosed in U.S. Pat. No. 5,472,592, issued on Dec. 5, 1995 to Lowery. The apparatus disclosed by Lowery comprises a tank structure for containing an electrolyte and an anode. A shaft is rotatably mounted within the tank to rotate about a first axis. An arm is mounted on the shaft, and a fixture for receiving the substrate is rotatably mounted on the arm to rotate about a second axis, so that the substrate is both revolved about the first axis and rotated about the second axis. The fixture wheel carries the substrate to be plated, such as a semiconductor wafer, which is mounted by three spring loaded electrical contacts. Electrical contact is maintained between the rotating substrate and a stationary power supply for plating. A flat annular gasket is received within an annular recess formed in the front face of the fixture wheel to seal the back face of the wafer. A solid sheet gasket or another type of seal such as an O-ring seal, can also be used to seal the wafer backside. However, metal will be plated on the edge of the wafer as well as on the contact of the plating device described in U.S. Pat. No. 5,472,592.

Accordingly, there exist a need for an apparatus and efficient methodology for preventing the undesirable electroplating of metal on contact fingers in electrical contact with a seed layer on a substrate during electroplating. There also exists a need for an apparatus and efficient methodology for preventing undesirable electrodeposition of metal on the backside and edges of a substrate during electroless plating and electroplating on the front side of the substrate.

DISCLOSURE OF THE INVENTION

An object of the present invention is an apparatus for electroplating a metal on a substrate while substantially preventing electroplating metal on contact fingers.

Another object of the present invention is a method of electroplating a metal on a substrate while substantially preventing electroplating metal on contact fingers.

A further object of the present invention is an apparatus for plating metal on the front side of a substrate while substantially preventing electrodeposition of metal on the backside and edges of the substrate.

Another object of the present invention is a method of plating a metal on the front side of a substrate while substantially preventing metal from electrodeposition on the backside and edges of the substrate.

According to the present invention, the foregoing and other objects are achieved in part by an apparatus for electroplating a metal film on a substrate comprising a backside, a front side, and a seed layer deposited on the front side, which apparatus comprises: a process chamber for accommodating the substrate on which the metal film is to be electroplated; a plurality of conductive contact fingers, each having a first end for electrical contact with the seed layer on the substrate; a shell comprising an inner wall surrounding each contact finger, which shell has a first end at about the first end of the contact finger, extending along a portion of the contact finger thereby forming a space between the contact finger and the surrounding inner wall of the shell; a source of gas; and a supply line connected to the source of gas for supplying gas into the space between the contact fingers and the surrounding inner wall of the shell.

Another aspect of the present invention is a process for electroplating a metal on a substrate comprising a backside and a front side with a seed layer deposited on the front side, which process comprises: establishing electrical contact between a first end of a contact finger and the seed layer; substantially surrounding a portion of the contact finger with a shell comprising an inner wall and a first end at about the first end of the contact finger extending along a portion of the contact finger forming a space between the contact finger and the surrounding inner wall of the shell; and flowing a gas into the space between the contact finger and surrounding inner wall of the shell to substantially prevent electroplating on the contact finger.

A further aspect of the present invention is an apparatus for plating a metal on a front side of a substrate comprising a backside and edges, which apparatus comprises: a tank containing a plating solution; a housing having a base wall and a circumferential sidewall extending from the base wall; at least one circumferentially disposed finger for retaining the substrate within the housing, such that the backside of the substrate is spaced apart from the upper base wall and the edges of the substrate are spaced apart from the extending circumferential sidewall by a surrounding space; and a gas inlet through the base wall of the housing for flowing gas into the space surrounding the substrate.

Another aspect of the present invention is a process for depositing a metal on a seed layer deposited on a front side of a substrate having edges and a backside, which process comprises: positioning the substrate in a housing having a base wall with a gas inlet therein and a circumferential sidewall extending from the base wall, such that the backside of the substrate is spaced apart from the base wall and the edges of the substrate are spaced apart from the circumferential sidewall by a surrounding space; placing a plating solution into a tank; immersing the housing in the plating solution; flowing a gas through the gas inlet into the surrounding space; and plating a metal from the solution onto the seed layer, whereby the flowing gas substantially prevents metal from plating onto the edges and backside of the substrate.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
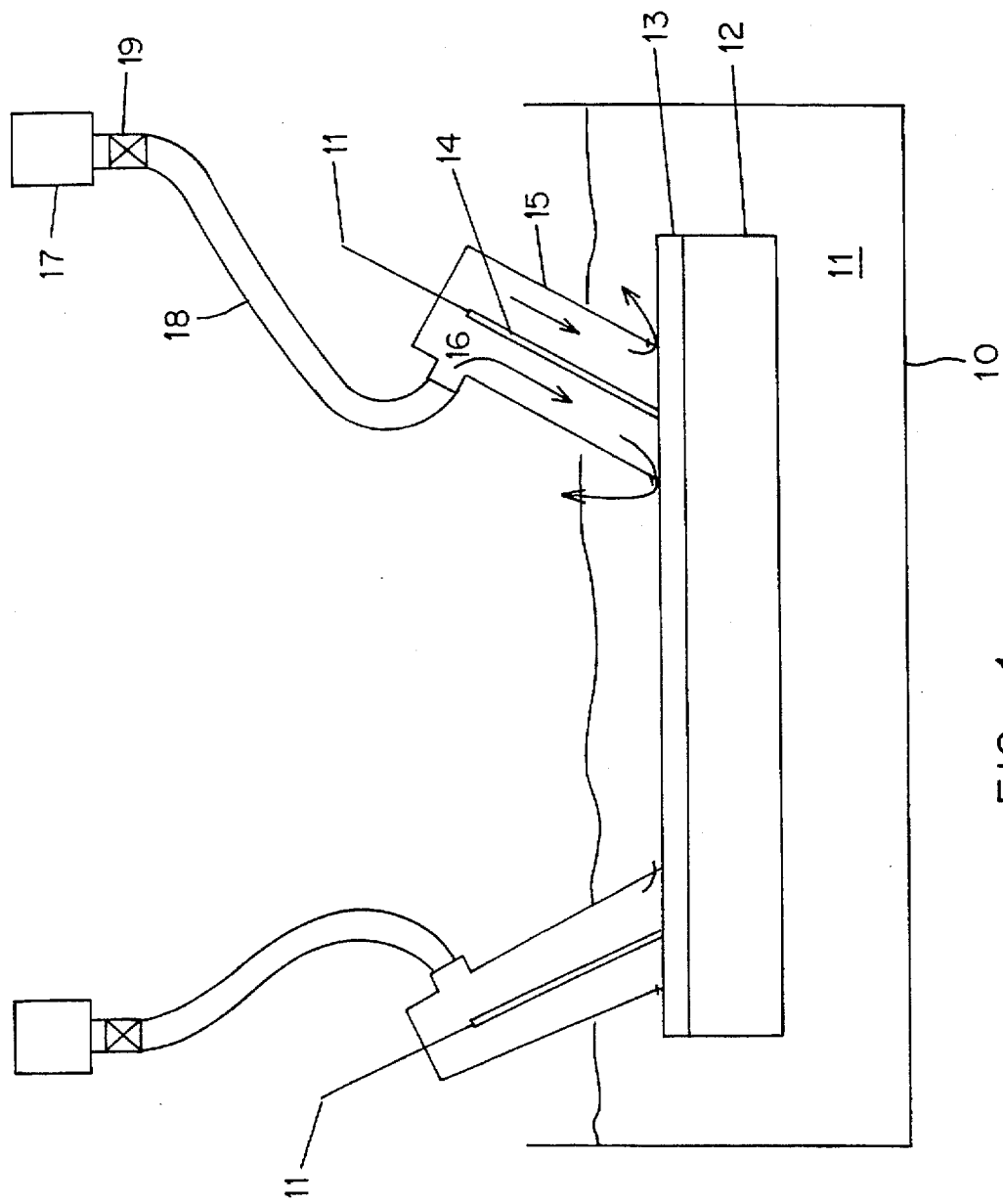
FIG. 1 schematically illustrates an electroplating apparatus in accordance with an embodiment in the present invention.

The present invention addresses and solves plating problems such as metal plating in undesired and problematic areas. During conventional electroplating techniques, electrical contact is established with a seed layer by means of contact fingers, typically metallic, which can have any of various geometrical shapes and can comprise conventional electrical wiring. During electroplating, metal is undesirably plated on the contact fingers, thereby increasing the contact resistance and causing a high voltage drop leading to failure. In addition, when electrical contact is lost, the plating solution will actually remove the plated deposit. Delamination of such plating from the metal fingers also results in undesirable particulate contamination of the plating solution and a consequential decrease in thickness uniformity of the plated deposit.

According to the present invention such undesirable electroplating on contact fingers is prevented or at least substantially reduced by providing a shell, such as a dielectric shell, surrounding each contact finger to form a space between the inner wall of the shell and outer surface of the contact finger. A gas, preferably under pressure and inert to the electroplating operation, such as air or nitrogen, is flowed in the space around the contact finger forming a flowing gas barrier, thereby preventing metal from electroplating on the contact finger and attendant disadvantages. The shell can be of any shape or form as, for example, cylindrical, and can comprise any of various dielectric materials, such as a thermoplastic material. The shell can extend from a point approximate the point of contact between the contact finger and the seed layer along a portion of the contact finger. The shell can extend a sufficient distance out of the electroplating solution to facilitate connection to a gas source.

The substrate containing the seed layer is immersed in a tank containing an electroplating solution. The gas is flowed from a gas source through a line connected to the dielectric shell into the space between the inner wall of the dielectric shell and the contact finger. The gas flows downwardly and escapes from the end of the dielectric shell proximate the contact finger terminal end on the seed layer in the form of bubbles through the plating solution into the atmosphere. The gas is flowed through the space between the inner walls of the dielectric shell and the contact finger to create a flowing barrier at a sufficient rate to prevent electroplating metal on the contact finger. One having ordinary skill in the art could easily optimize the gas flow rate in a particular situation. For example, it has been found that a gas flow rate of about 1 SCFM to 20 SCFM is generally effective. A valve for adjusting the gas flow rate can be provided at a convenient location between the gas source and inlet to the dielectric shell. A suitable rotating means, such as a conventional rotatable carrier, can be provided within the tank for rotating the substrate. The metal fingers can comprise any electrical conductive material to effect electrical contact with the seed layer and a suitable power input. Conventional platinized titanium fingers have been found suitable for use in the present invention.

The present inventive technique can be advantageously applied to electroplating Cu or a Cu alloy, such a Cu-base alloy, on a semiconductor substrate to form contact patterns as well as metallization layers. An embodiment of the present invention is schematically illustrated in FIG. 1 and comprises a process chamber or tank 10 containing an electroplating solution 11. A substrate 12, comprising a seed layer 13 deposited on a front side thereof, is immersed in the electroplating solution. For example, the substrate can comprise a semiconductor substrate and the seed layer can comprise a layer suitable for electroplating Cu or a Cu-base alloy thereon. Such a seed layer can comprise a Cu-refractory metal alloy as disclosed in copending application Ser. No. 08/857,129 filed May 15, 1997 (Our Docket No. 1033-226).

With continued reference to FIG. 1, contact fingers 14 are provided with a first end in electrical contact with seed layer 13 and a second end suitably connected to a current source to effect electroplating metal on seed layer 13. Shell 15 is provided about the circumference of each contact finger 14 extending from about the first end of the dielectric finger 14 forming a circumferential space 16 between the inner wall of shell 15 and contact finger 14. A source of gas 17, e.g., a pressurized gas inert to electroplating, is connected to shell 15 by means of gas line 18. A valve 19 can be provided for adjusting the gas flow rate through circumferential space 16 between the inner wall of dielectric shell 15 and contact finger 14. The gas flow rate is adjusted to form a flowing gas barrier in the direction indicated by arrows which substantially prevents metal from electroplating on contact finger 14. The gas flowing through circumferential space 16 passes downwardly and out of the bottom end of shield 15 approximate the point of contact finger 14 with seed layer 13.

The embodiment depicted in FIG. 1, effectively prevents metal from electroplating on contact fingers 14, thereby avoiding particulate contamination, and deplating which occurs upon failure of electrical contact due to increased resistance and a voltage drop. The embodiment depicted in FIG. 1 also avoids the need to frequently clean the dielectric fingers, thereby increasing production throughput.

In another embodiment in the present invention, undesirable plating of metal on the backside and edges of a substrate is substantially prevented by providing a flowing gas barrier. Conventional practices to avoid such undesirable backside and side edge metal plating comprised the use of an O-ring to isolate the backside and side edges; however, such an approach is not particularly effective. The flowing gas barrier technique of the present invention is particularly effective in preventing backside and edge metal plating in both electroplating and electroless plating processes, preferably in electroless plating processes.

In accordance with such an embodiment, undesirable metal plating on the backside and/or edges of a substrate is substantially prevented by positioning the substrate in a housing comprising a base wall with a gas inlet therethrough and a circumferential sidewall extending downwardly from the base wall. The substrate is positioned within the housing so that a space is formed between the substrate and the housing. The substrate, such as a semiconductor substrate having a seed layer thereon, is also positioned within the housing so that the seed layer faces downwardly. The substrate can be retained within the housing by one or more circumferential fingers, e.g., dielectric fingers.

The housing, with the substrate positioned therein, is immersed in a tank containing a plating solution. A gas, for example, a gas inert with respect to the plating process, such as air or nitrogen, is flowed into the housing, as through a gas line connected to the gas inlet through the base wall of the housing. The gas is flowed through the space between the housing and the substrate primarily on the backside and side edges of the substrate, at a gas flow rate sufficient to substantially prevent metal from plating on the backside and side edges. A valve can be provided to adjust the gas flow rate. One having ordinary skill in the art could easily optimize the gas flow rate in a particular situation to substantially prevent metal plating on the backside and/or edges of the substrate. For example, it has been found that a gas flow rate of about 1 SCFM to about 20 SCFM is generally effective.

The retaining fingers can comprise any dielectric material, such as a thermoplastic material. In addition, rotating means, such as a conventional rotating carrier, can be provided to rotate the substrate and/or housing during plating.

Figure 2:
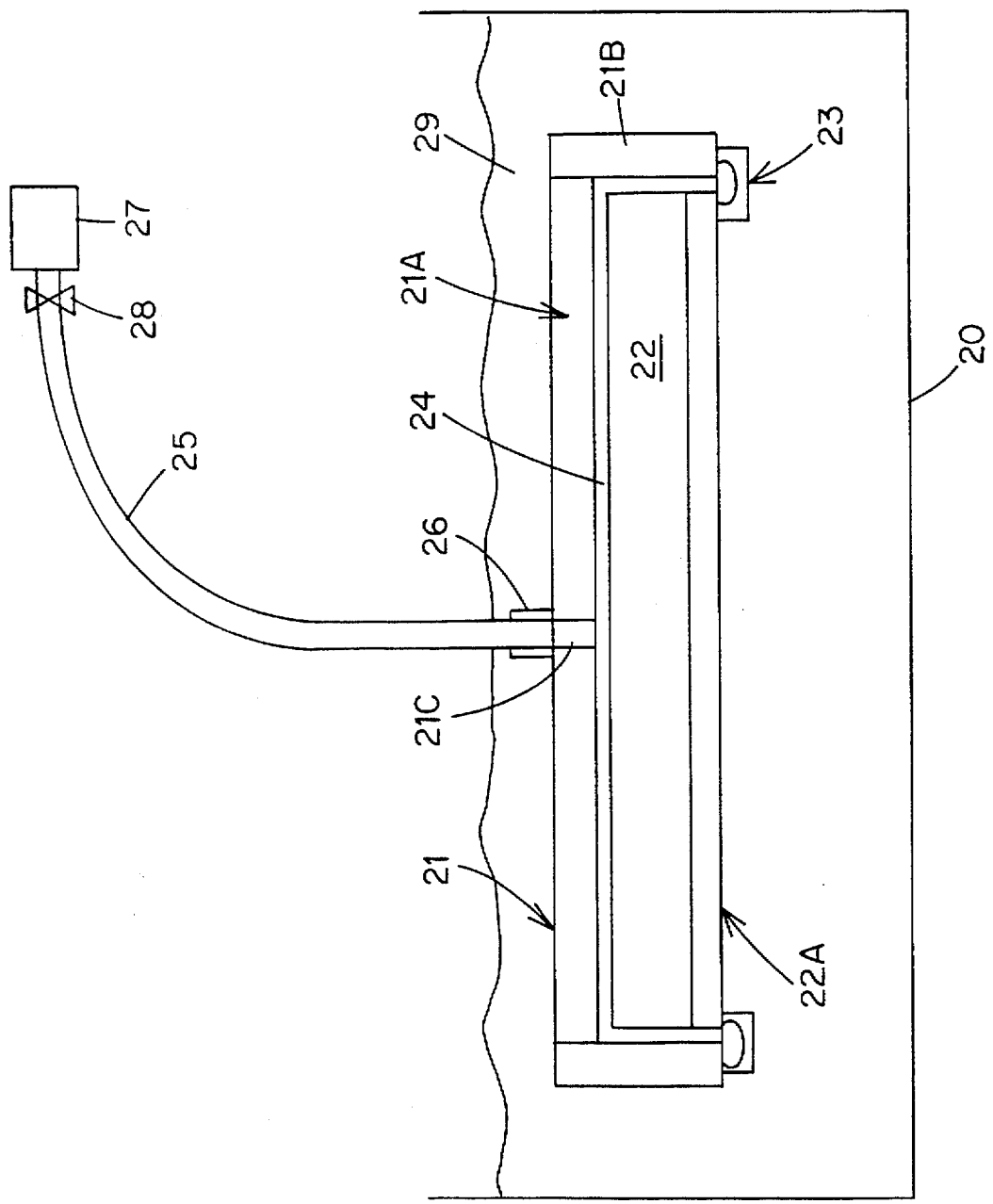
FIG. 2 schematically illustrates a plating apparatus in accordance with another embodiment of the present invention.

An embodiment for substantially preventing metal plating on the backside and edges of a substrate is schematically illustrated in FIG. 2 and comprises a tank 20 in which housing 21 is immersed. Housing 21 comprises an upper base wall 21A, having a gas inlet 21C therethrough, and circumferential sidewall 21B extending downwardly from upper base wall 21A. A substrate 22 is retained within housing 21 such that seed layer 22A on the front side of substrate 22 faces downwardly. Substrate 22 is shown retained within housing 21 by circumferentially disposed dielectric fingers 23, such that a surrounding space 24 is formed between the upper side of substrate 22 and upper base wall 21A and between the edges of substrate 22 and circumferential downwardly extending sidewall 21B.

Gas line 25 is connected at one end to gas inlet 21C by gas coupling 26 and to pressurized gas source 27 at the other end. A valve 28 is provided to control the gas flow rate through gas inlet 21C into space 24. Tank 20 is filled with a plating solution 29 for electroplating or electroless plating. Conventional rotating means, such as a rotating carrier (not shown), for rotating the substrate or housing can be optionally provided to enhance plating uniformity, consistent with conventional practices.

Figure 3:
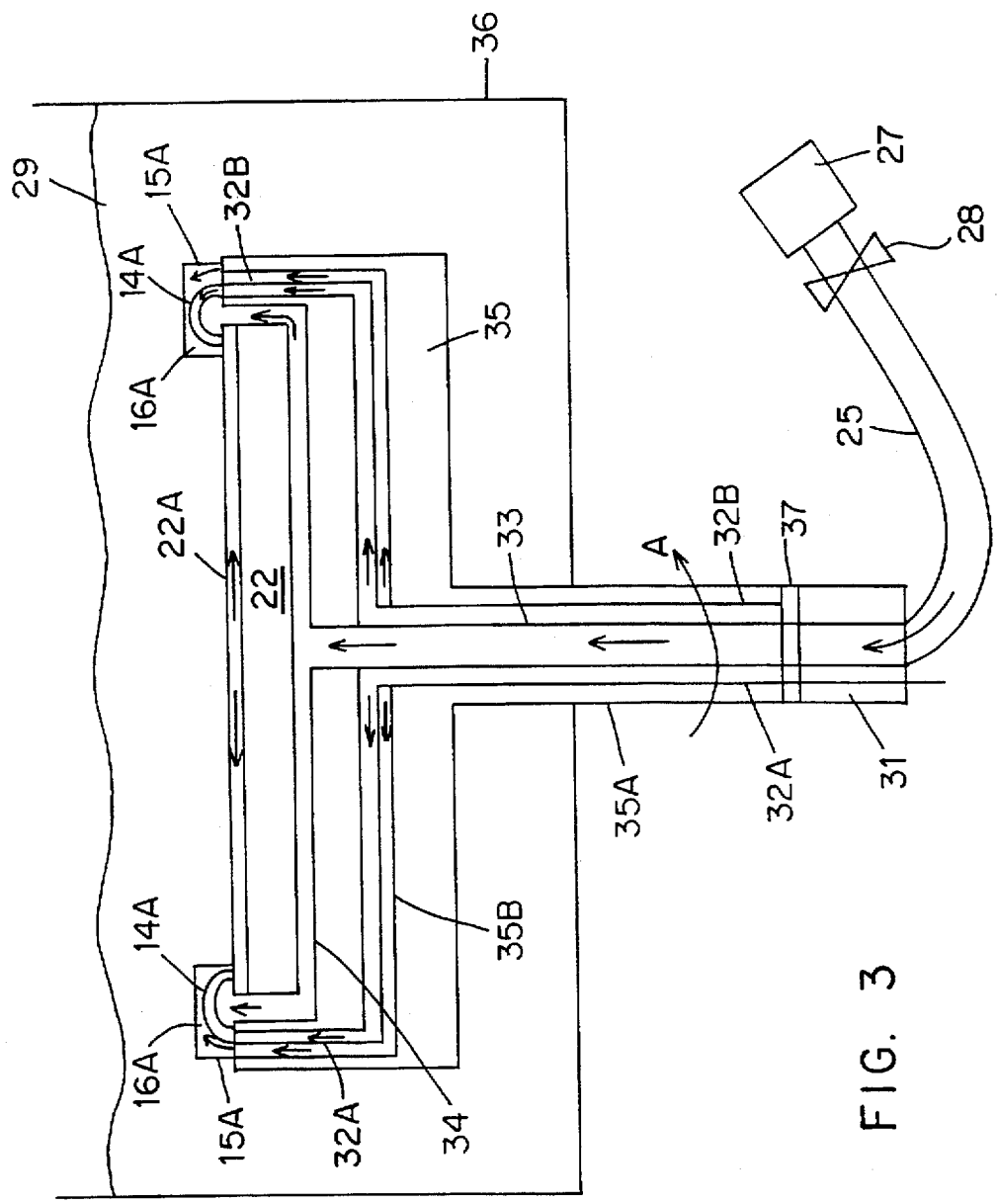
FIG. 3 schematically illustrates a plating apparatus in accordance with another embodiment of the present invention.

In another embodiment of the present invention, a substrate is retained within a housing such that the seed layer faces upwardly within a housing which also opens upwardly within a tank, thereby substantially preventing metal plating on the backside and edges of the substrate as well as on contact fingers. Adverting to FIG. 3, housing 35 is formed integrally with cylindrical support 35A for rotation, as indicated by arrow A, powered by a conventional motor (not shown). Substrate 22 is positioned within housing 35, with seed layer 22A facing upwardly, and is retained within housing by fingers 14A. Surrounding gas space 34 substantially prevents metal plating on the backside and edges of wafer 22. Shell 15A is provided around the contact finger 14A forming a space 16A between the inner wall of shell 15A and contact finger 14A. Gas flowing in space 16A between the inner wall of shell 15A and contact finger 14A provide protection of contact finger to electroplating. No plating on contact fingers 14A was observed. Nonrotating cylinder 31 is connected to cylinder 35A by means of a conventional electrical coupling 37, such as a nickel-cadmium coupling available from Senitool, Inc., of Kalispell, Mont. Cylinder 31 is provided to accommodate electrical wiring 32A, 32B and to support gas line 25. Internal passages 35B accommodate electrical wiring 32A and 32B and provide a path for gas flow. Elements similar to those in FIG. 1 and FIG. 2 bear similar reference numerals.

The electroplating and electroless plating solutions employed in practicing the various embodiments of the present invention are conventional, including Cu or Cu-base alloy plating solutions and, hence, not described herein in detail. The embodiments of the present invention can be practiced in conventional tanks or apparatus for electroplating and electroless plating, such as the electroplating processing chamber commercially marketed by Semitool of Kalispell, Mont.

The present invention enjoys general applicability in plating any of the various metals on any various types of substrate, but is particular applicable to plating Cu and Cu-alloys during manufacturing semiconductor devices employing a semiconductor substrate, particularly for ULSI devices and interconnect patterns and metallization layers with high reliability.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A process for electroplating a metal on a substrate comprising a backside and a front side with a seed layer deposited on the front side, which process comprises:

establishing electrical contact between a first end of a contact finger and the seed layer;

substantially surrounding a portion of the contact finger with a shell comprising an inner wall and a first end at about the first end of the contact finger extending along a portion of the contact finger forming a space between the contact finger and the surrounding inner wall of the shell;

flowing a gas into the space between the contact finger and surrounding inner wall of the shell to substantially prevent electroplating on the contact finger; and electroplating the metal on the substrate.

2. The process according to claim 1, further comprising: placing an electroplating solution in a process chamber and immersing the substrate in the electroplating solution.

3. The process according to claim 1, comprising rotating the substrate during the electroplating.

4. The process according to claim 1, comprising flowing the gas at a flow rate of about 1 SCFM to about 20 SCFM.

5. The process according to claim 1, wherein the substrate comprises a semiconductor substrate.

6. The process according to claim 5, comprising electroplating copper or a copper-base alloy on the substrate.

7. The process according to claim 1, wherein the shell comprises a dielectric material.

8. The process according to claim 1, wherein the gas is substantially inert with respect to electroplating.

9. The process according to claim 8, wherein the gas comprises air or nitrogen.

* * * * *